United States Patent
Sunaga et al.

(10) Patent No.: US 9,397,030 B2
(45) Date of Patent: Jul. 19, 2016

(54) SEMICONDUCTOR MODULE (71) Applicant: NSK Ltd., Shinagawa-ku, Tokyo (JP)

(72) Inventors: Takashi Sunaga, Tokyo (JP); Noboru Kaneko, Tokyo (JP); Osamu Miyoshi, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/435,690

(22) PCT Filed: Oct. 25, 2013

(86) PCT No.: PCT/JP2013/006342
§ 371 (c)(1),
(2) Date: Apr. 14, 2015

(87) PCT Pub. No.: WO2014/068937
PCT Pub. Date: May 8, 2014

(65) Prior Publication Data
US 2015/0270199 A1    Sep. 24, 2015

(30) Foreign Application Priority Data

Nov. 5, 2012  (JP) ................. 2012-243684
Aug. 27, 2013 (JP) ................. 2013-175769

(51) Int. Cl.
*H01L 23/495* (2006.01)
*B62D 5/04* (2006.01)
(Continued)

(52) U.S. Cl.
CPC ........ *H01L 23/49551* (2013.01); *B62D 5/0406* (2013.01); *H01L 23/49524* (2013.01);
(Continued)

(58) Field of Classification Search
CPC ................. H01L 23/49551; H01L 23/49562; H01L 23/49524; H01L 24/41; H01L 24/37; H01L 2224/4103; H01L 2224/92247; H01L 2224/84801; H01L 2224/41175; H01L 2224/37011; H01L 2224/84815; H01L 2224/83424; H01L 2224/84424; H01L 2224/40106; H01L 2224/84447
See application file for complete search history.

(56) References Cited

U.S. PATENT DOCUMENTS 5,872,403 A     2/1999  Bowman et al.
8,895,998 B2 *  11/2014 Hussell ......................... 257/787
2007/0069344 A1 3/2007 Yamashita et al.

FOREIGN PATENT DOCUMENTS

EP    1 355 349 A2     10/2003
JP    2000-124398 A    4/2000
(Continued)

OTHER PUBLICATIONS

International Preliminary Report on Patentability (PCT/IB/338 & PCT/IB/373) dated May 14, 2015, including English translation of document C2 (Japanese-language Written Opinion (PCT/ISA/237)) previously filed on Apr. 14, 2015 (six pages).

(Continued)

*Primary Examiner* — David Vu
(74) *Attorney, Agent, or Firm* — Crowell & Moring LLP (57) ABSTRACT

A semiconductor module is provided for shortening a manufacturing tact time, reducing manufacturing costs and for ensuring reliability of a bonding portion. The semiconductor module includes a substrate formed of a metal, an insulating layer formed on the substrate, a plurality of wiring patterns formed on the insulating layer, a bare-chip transistor mounted on one wiring pattern via a solder, and copper connectors that connect electrodes formed on the bear-chip transistor and other wiring patterns via a solder. The copper connectors have a bridge shape, have a width-reduced portion formed in the vicinity of the bonding face to the electrodes, and have a stress-reducing portion formed on the bonding face bonded to the electrode.

8 Claims, 10 Drawing Sheets

(51) Int. Cl.
*H01L 25/18* (2006.01)
*H01L 23/00* (2006.01)
*H01L 25/07* (2006.01)

(52) U.S. Cl.
CPC .......... *H01L23/49562* (2013.01); H01L 24/37
(2013.01); H01L 24/41 (2013.01); H01L 25/07
(2013.01); *H01L 24/29* (2013.01); *H01L 24/32*
(2013.01); *H01L 24/33* (2013.01); *H01L 24/35*
(2013.01); *H01L 24/40* (2013.01); *H01L 24/73*
(2013.01); *H01L 24/83* (2013.01); *H01L 24/84*
(2013.01); *H01L 24/92* (2013.01); *H01L 25/072*
(2013.01); *H01L 25/18* (2013.01); *H01L
2224/29101* (2013.01); *H01L 2224/32225*
(2013.01); *H01L 2224/32245* (2013.01); *H01L
2224/33181* (2013.01); *H01L 2224/352*
(2013.01); *H01L 2224/3701* (2013.01); *H01L
2224/37011* (2013.01); *H01L 2224/37013*
(2013.01); *H01L 2224/37147* (2013.01); *H01L
2224/40095* (2013.01); *H01L 2224/40106*
(2013.01); *H01L 2224/40159* (2013.01); *H01L
2224/40225* (2013.01); *H01L 2224/4103*
(2013.01); *H01L 2224/41175* (2013.01); *H01L
2224/73263* (2013.01); *H01L 2224/77272*
(2013.01); *H01L 2224/8321* (2013.01); *H01L
2224/83192* (2013.01); *H01L 2224/83424*
(2013.01); *H01L 2224/83447* (2013.01); *H01L
2224/83815* (2013.01); *H01L 2224/84095*
(2013.01); *H01L 2224/84424* (2013.01); *H01L
2224/84447* (2013.01); *H01L 2224/84801*
(2013.01); *H01L 2224/84815* (2013.01); *H01L
2224/92246* (2013.01); *H01L 2224/92247*
(2013.01); *H01L 2924/014* (2013.01); *H01L
2924/1306* (2013.01); *H01L 2924/13055*
(2013.01); *H01L 2924/15724* (2013.01); *H01L
2924/19041* (2013.01); *H01L 2924/19105*
(2013.01); *H01L 2924/351* (2013.01)

(56) References Cited

FOREIGN PATENT DOCUMENTS

| JP | 2002-43508 A | 2/2002 |
|---|---|---|
| JP | 2003-243601 A | 8/2003 |
| JP | 2004-335725 A | 11/2004 |
| JP | 2005-64441 A | 3/2005 |
| JP | 2007-95984 A | 4/2007 |
| JP | 2008-294275 A | 12/2008 |
| JP | 2009-21395 A | 1/2009 |
| JP | 2010-195219 A | 9/2010 |
| JP | 2011-204886 A | 10/2011 |
| JP | 2012-212712 A | 11/2012 |
| JP | 2012-212713 A | 11/2012 |
| WO | WO 2011/117939 A1 | 9/2011 |

OTHER PUBLICATIONS

Extended European Search Report issued in counterpart European Application No. 13851001.1 dated Jan. 4, 2016 (twelve (12) pages).
International Search Report (PCT/ISA/210) dated Dec. 24, 2013, with English translation (four (4) pages).
Japanese-language Written Opinion (PCT/ISA/237) dated Dec. 24, 2013 (three (3) pages).
Notification of Reasons for Refusal dated Mar. 24, 2015, with English translation (eight (8) pages).

* cited by examiner

REFLOW

SEMICONDUCTOR MODULE

TECHNICAL FIELD

The present invention relates to a semiconductor module such as a power module incorporated into an electrical apparatus for use in an automobile.

BACKGROUND ART

In recent years, electronic devices have been introduced for controlling various electrical apparatuses in a vehicle such as an automobile. In an electric power steering apparatus, as an example of an electrical apparatus, into which an electronic device is incorporated, a housing in which an electric motor for steering an automobile housed is provided with a motor drive unit and the electronic device is mounted on the motor drive unit. The electronic device is incorporated as a power module into the motor drive unit.

The power module is configured to be a so-called semiconductor module on which a power element such as a Field Effect Transistor (FET) or an Insulated Gate Bipolar Transistor (IGBT) suitable for controlling an electrical apparatus such as an electric power steering apparatus which is driven with a relatively large current. Such a type of power module is also called "in-vehicle module", because it is mounted on a vehicle.

For example, a technique described in PTL 1 is known as such a type of semiconductor module. In this technique, wiring is used as electrical interconnections connecting wiring patterns and bare-chip transistors on a metal substrate.

For example, as a technique described in PTL 2, lead components electrically connecting semiconductor devices mounted on a metal substrate are formed to be larger than electrodes on a semiconductor, and in addition, to have plural contacts or to have an increased contact width so as to ensure reliability of contact portions.

For example, as a technique described in PTL 3, a stand-up folded portion is formed or a fuse shape (wave shape) is formed in the wiring so as to reduce the stress of connector wiring.

CITATION LIST

Patent Literature

PTL 1: JP 2004-335725 A
PTL 2: JP 2007-95984 A
PTL 3: JP 2000-124398 A

SUMMARY OF INVENTION

Technical Problem

In the technique described in PTL 1, however, since the electrical interconnections with wiring are employed, it is necessary to mount the electrical interconnections by using a wire bonding apparatus. That is, unlike soldering of other electronic components, it is necessary to separately carry out the forming step and thus the manufacturing tact time extends. Since a dedicated wire bonding apparatus is necessary, the manufacturing costs increase.

In the technique described in PTL 2, since a large contact is formed, the bonding face is excessively large and thus the contact is susceptible to torsion or thermal contraction. Accordingly, it is difficult to ensure the reliability of the bonding portion. In the technique described in PTL 3, the fuse shape is formed in the wiring, but it is difficult to form the fuse shape and its usefulness is poor.

Therefore, an object of the present invention is to provide a semiconductor module which can shorten the manufacturing tact time, reduce manufacturing costs, and ensure the reliability of a bonding portion.

Solution to Problem

In order to achieve the above-mentioned object, an aspect of the present invention provides the following semiconductor module. That is, according to an aspect of the present invention, there is provided a semiconductor module including: a substrate formed of a metal; an insulating layer formed on the substrate; a plurality of wiring patterns formed on the insulating layer; a bare-chip transistor mounted on one of the plurality of wiring patterns via a solder; and a copper connector formed of a copper plate and connecting an electrode formed on a top surface of the bear-chip transistor and another one of the plurality of wiring patterns via a solder, wherein the copper connector includes a flat portion, a first leg portion folded downward extending from one end of the flat portion and bonded to the electrode, and a second leg portion folded downward extending from the other end of the flat portion and bonded to the another one of the plurality of wiring patterns to form a bridge shape, and wherein a width-reduced portion having a width smaller than another part of the first leg portion is formed in the vicinity of the bonding face of the first leg portion bonded to the electrode, and a stress-reducing portion having a shape for reducing stress acting on the bonding face is formed on the bonding face of the first leg portion bonded to the electrode.

That is, since the copper connector is different in thermal expansion coefficient and thermal contraction coefficient from the substrate, the copper connector has a shape capable of absorbing displacement in the vertical direction, the lateral direction, the longitudinal direction, and the torsion direction of a bonding portion of the copper connector generated by heating or cooling. In this way, since the copper connector formed of a copper plate is used as a connection member between the electrode of the bare-chip transistor and the wiring pattern on the substrate, such a connection can be carried out in the soldering work. That is, the connection between the electrode of the bare-chip transistor and the wiring pattern on the substrate and the soldering work performed to mount the bare-chip transistor or other substrate-mounted components on the wiring pattern on the substrate can be simultaneously carried out by using the same equipment or the same step. Accordingly, it is possible to shorten the manufacturing tact time of the semiconductor module and to make a dedicated wire bonding apparatus unnecessary, thereby reducing the manufacturing costs of the semiconductor module.

By forming the copper connector in a bridge form, a displacement in the lateral direction can be absorbed. By providing the width-reduced portion to the first leg portion of the copper connector bonded to the electrode of the bare-chip transistor, displacements in the longitudinal direction and the torsion direction can be absorbed. Since the stress-reducing portion is provided to the bonding face of the first leg portion to the electrode, it is possible to reduce the stress acting on the bonding portion. Therefore, when thermal expansion or thermal contraction occurs by a reflow process or operational heat, it is possible to suppress removal of the solder between the copper connector and the electrode of the bare-chip transistor, thereby ensuring the reliability of the bonding portion.

In the semiconductor module, as the stress-reducing portion, a notch portion may be formed in the bonding face, the bonding face may be formed to have a small thickness, a chamfered portion may be formed at a corner of the bonding face, or a hole may be formed at the center of the bonding face. In this way, since the bonding portion can be branched into two parts by forming the notch portion and the width of the respective bonding portions can be further decreased, it is easy to follow even torsion. Since there are two contacts to form a so-called dual system, it is possible to improve electrical reliability.

When a thin plate shape is employed as the stress-reducing portion, the thickness is small and thus it is easy to twist the stress-reducing portion and to absorb a displacement. When a rounded tip is employed as the stress-reducing portion, it is possible to avoid stress concentration on the corners due to torsion. When the hole is formed as the stress-reducing portion, the solder flows on the top surface of the bonding face by an infiltration and wetting phenomenon and radially extends and thus it is not easy to remove the solder even with torsion.

In the semiconductor module, a dumbbell portion having a dumbbell shape for reducing the stress acting on the bonding face may be formed in each of the first leg portion and the second leg portion.

Advantageous Effects of Invention

In the semiconductor module according to the present invention, since the connection between the electrode of the bare-chip transistor and the wiring pattern on the substrate can be performed in the soldering work by using the copper connector formed of a copper plate, the connection between the electrode of the bare-chip transistor and the wiring pattern on the substrate can be performed simultaneously in the same process as the soldering work which is performed to mount the bare-chip transistor or other substrate-mounted components on the wiring patterns on the substrate. Accordingly, it is possible to shorten the manufacturing tact time of the semiconductor module and to make a dedicated wire bonding apparatus unnecessary, thereby reducing the manufacturing costs of the semiconductor module.

Since the copper connector is formed in a bridge shape and the width-reduced portion and the stress-reducing portion are formed in the first leg portion bonded to the electrode of the bare-chip transistor, it is possible to absorb displacements in all directions. Accordingly, it is possible to absorb thermal deformation of the copper connector in the reflow process, thereby ensuring the reliability of the bonding portion. In addition, it is possible to prevent damage of the copper connector due to a temperature variation when used as a product.

DESCRIPTION OF EMBODIMENT

Hereinafter, embodiments of the present invention will be described with reference to the accompanying drawings.

Figure 1:
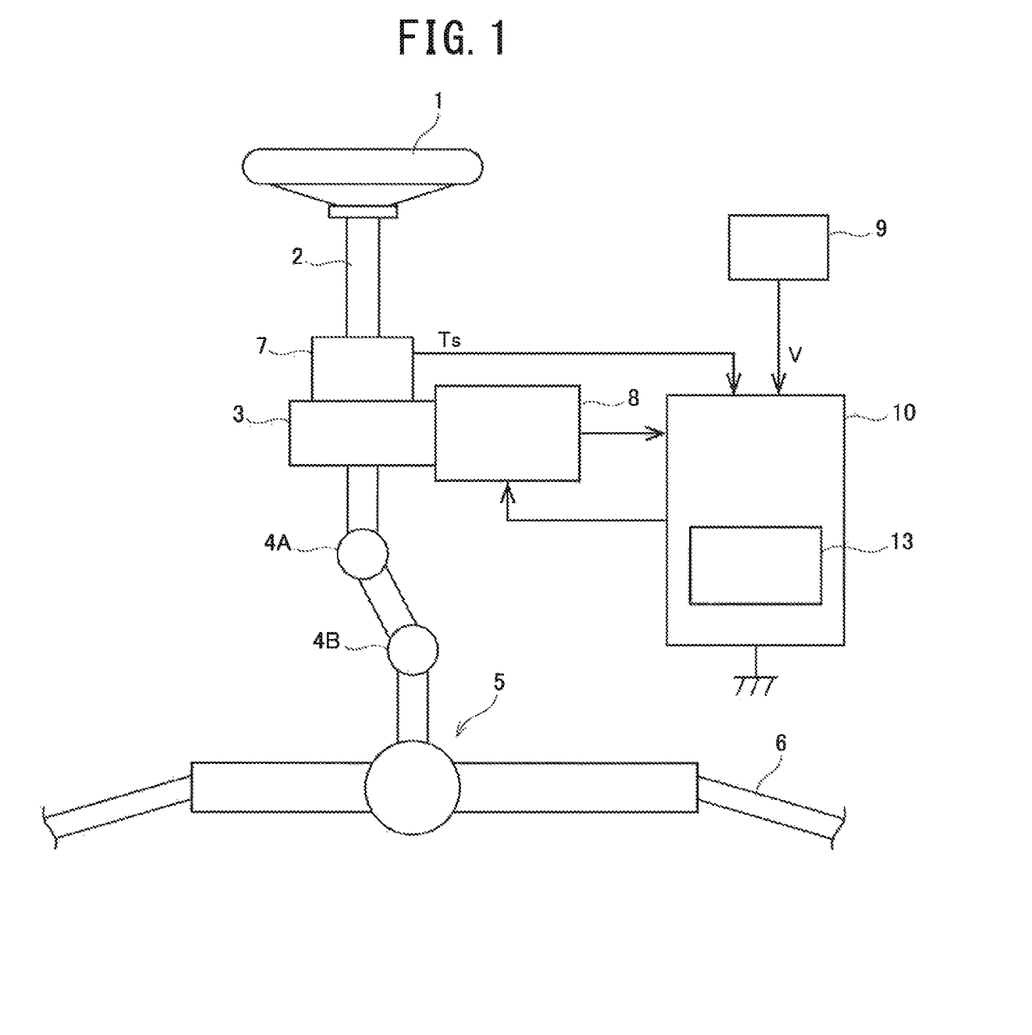
FIG. 1 is a diagram illustrating a basic structure of an electric power steering apparatus employing a semiconductor module according to the present invention.

FIG. 1 is a diagram illustrating a basic structure of an electric power steering apparatus employing a semiconductor module according to the present invention. In the electric power steering apparatus illustrated in FIG. 1, a column shaft 2 of a steering wheel 1 is coupled to tie rods 6 of running wheels via a reduction gear 3, universal joints 4A and 4B, and a rack and pinion mechanism 5. The column shaft 2 is provided with a torque sensor 7 for detecting the steering torque of the steering wheel 1, and an electric motor 8 for assisting the steering force of the steering wheel 1 is coupled to the column shaft 2 via the reduction gear 3.

Figure 2:
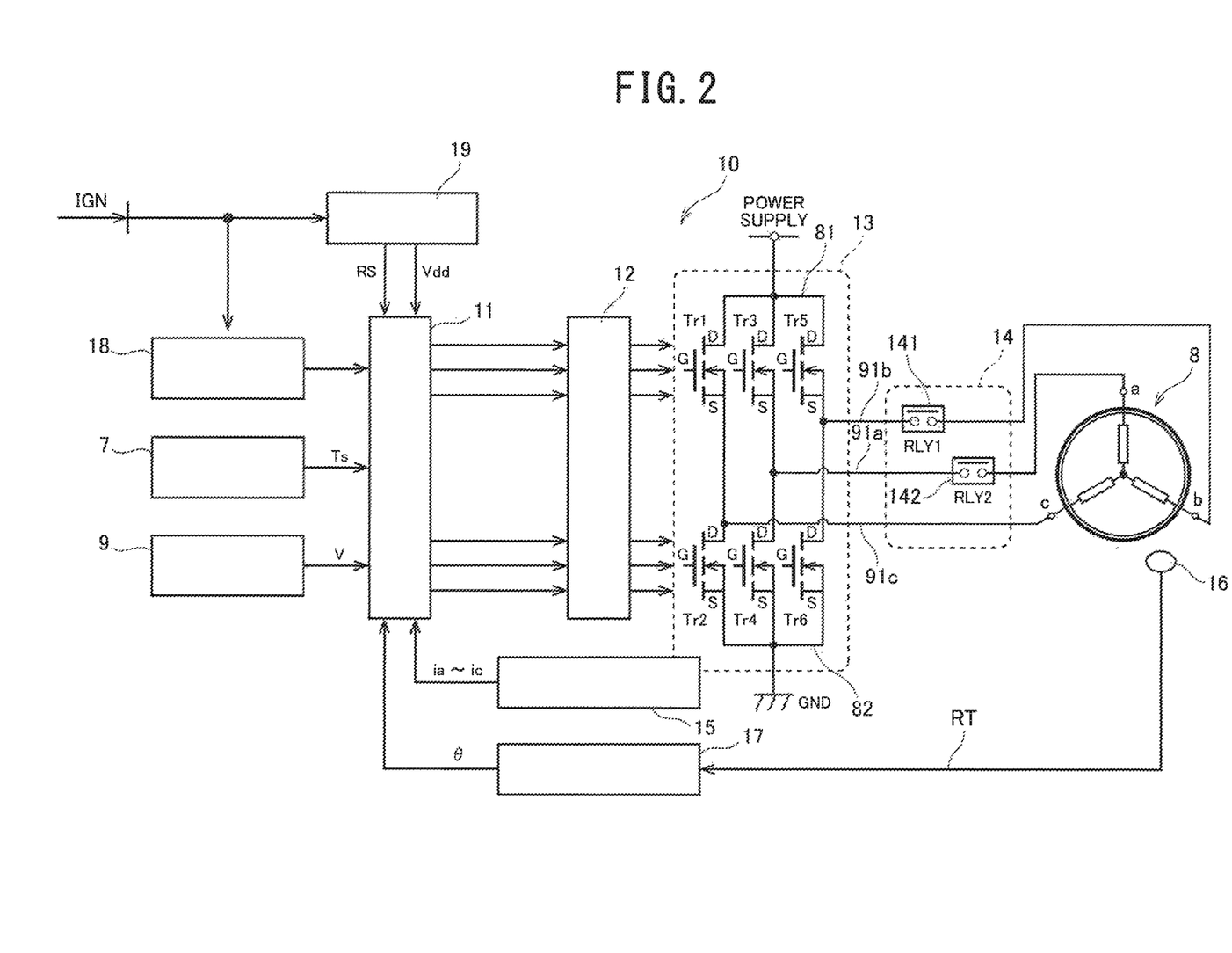
FIG. 2 is a block diagram illustrating a control system of a controller.

A controller 10 that controls the electric power steering apparatus is supplied with electric power from a battery, not illustrated, and an ignition key signal IGN (see FIG. 2) is input into the controller 10 via an ignition key, not illustrated. The controller 10 computes a steering assist command value as an assist (steering assist) command on the basis of a steering torque Ts detected by the torque sensor 7 and a vehicle speed V detected by a vehicle speed sensor 9, and controls a current supplied to the electric motor 8 on the basis of the computed steering assist command value. The controller 10 is mainly configured with a micro computer, and the mechanism and configuration of the controlling device thereof are illustrated in FIG. 2.

The steering torque Ts detected by the torque sensor 7 and the vehicle speed V detected by the vehicle speed sensor 9 are input to a control computing device 11 as a control computing unit, and a current command value computed by the control computing device 11 is input to a gate drive circuit 12. A gate drive signal generated by the gate drive circuit 12 based on the current command value is input to a motor drive unit 13 including a bridge configuration of FETs. The motor drive unit 13 drives the electric motor 8 including a three-phase brushless motor via a breaker device 14 for emergency stop. Each of phase currents of the three-phase brushless motor is detected by a current detecting circuit 15. The detected three-phase motor currents is to is are input to the control computing device 11 as feedback currents. In addition, the three-phase brushless motor is equipped with a rotation sensor 16 such as a Hall sensor. A rotation signal RT from the rotation sensor 16 is input to a rotor position detecting circuit 17 and the detected rotation position θ is input to the control computing device 11.

The ignition signal IGN from the ignition key is input into an ignition voltage monitoring unit 18 and a power supply circuit unit 19. Source voltage Vdd from the power supply circuit unit 19 is input to the control computing device 11 and a reset signal RS for stopping the apparatus is input to the control computing device 11. The breaker device 14 includes relay contacts 141 and 142 for breaking two phases.

The circuit configuration of the motor drive unit 13 will be described below. A serial connection of FETs Tr1 and Tr2, a serial connection of FETs Tr3 and Tr4, and a serial connection of FETs Tr5 and Tr6 are connected in series to a power supply line 81. A parallel connection of FETs Tr1 and Tr3, a parallel connection of FETs Tr5 and Tr2, and a parallel connection of FETs Tr4 and Tr6 are connected to a ground line 82, with respect to the power supply line 81. An inverter is configured as described above.

In such a configuration, in the FETs Tr1 and Tr2, the source electrode S of the FET Tr1 and the drain electrode D of the FET Tr2 are connected in series to form a c-phase arm of the three-phase motor, and a current is output at a c-phase output line 91c. In the FETs Tr3 and Tr4, the source electrode S of the FET Tr3 and the drain electrode D of the FET Tr4 are connected in series to form an a-phase arm of the three-phase motor, and a current is output at an a-phase output line 91a. In the FETs Tr5 and Tr6, the source electrode S of the FET Tr5 and the drain electrode D of the FET Tr6 are connected in series to form a b-phase arm of the three-phase motor and a current is output at a b-phase output line 91b.

Figure 3:
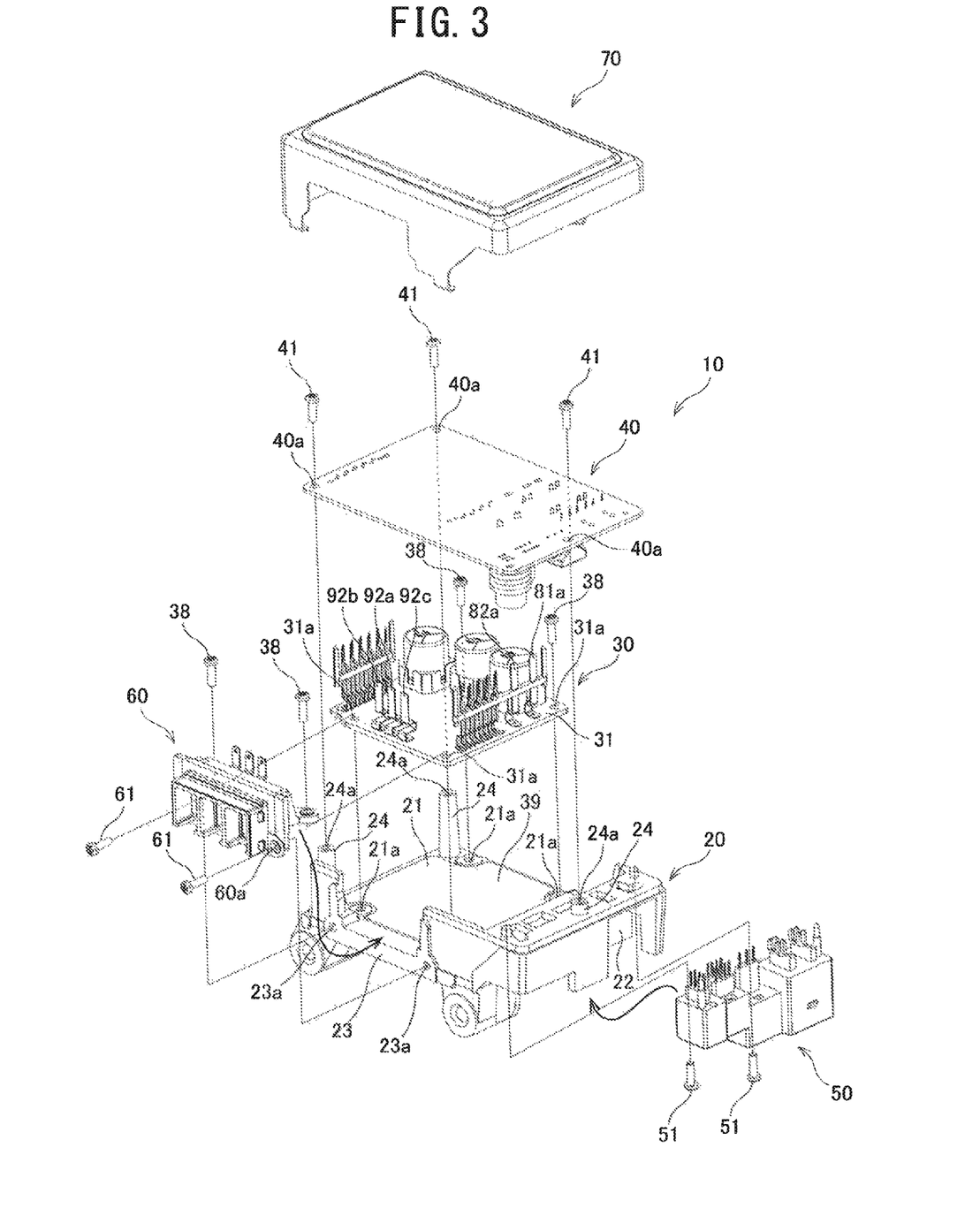
FIG. 3 is an exploded perspective view of the controller including the semiconductor module.

FIG. 3 is an exploded perspective view of the controller 10 including the semiconductor module of the electric power steering apparatus illustrated in FIG. 1. The controller 10 includes a case 20, a semiconductor module 30 as a power module including the motor drive unit 13, a heat-dissipating sheet 39, a control circuit board 40 including the control computing device 11 and the gate drive circuit 12, a power and signal connector 50, a three-phase output connector 60, and a cover 70.

Here, the case 20 is formed to have a substantially rectangular shape and includes a tabular semiconductor module mounting part 21 on which the semiconductor module 30 is mounted, a power and signal connector mounting part 22 arranged at an end part in a length direction of the semiconductor module mounting part 21 so as to mount the power and signal connector 50 thereon, and a three-phase output connector mounting part 23 arranged at an end in a width direction of the semiconductor module mounting part 21 so as to mount the three-phase output connector 60 on the three-phase output connector mounting part 23.

Plural screw holes 21a into which an attachment screw 38 for attaching the semiconductor module 30 is screwed are formed on the semiconductor module mounting part 21. The semiconductor module mounting part 21 and the power and signal connector mounting part 22 are provided with plural attachment posts 24 vertically standing up for attaching the control circuit board 40. Screw holes 24a into which an attachment screw 41 for attaching the control circuit board 40 is screwed are formed on the attachment posts 24, respectively. Plural screw holes 23a into which an attachment screw 61 for attaching the three-phase output connector 60 is screwed are formed on the three-phase output connector mounting part 23.

Figure 4:
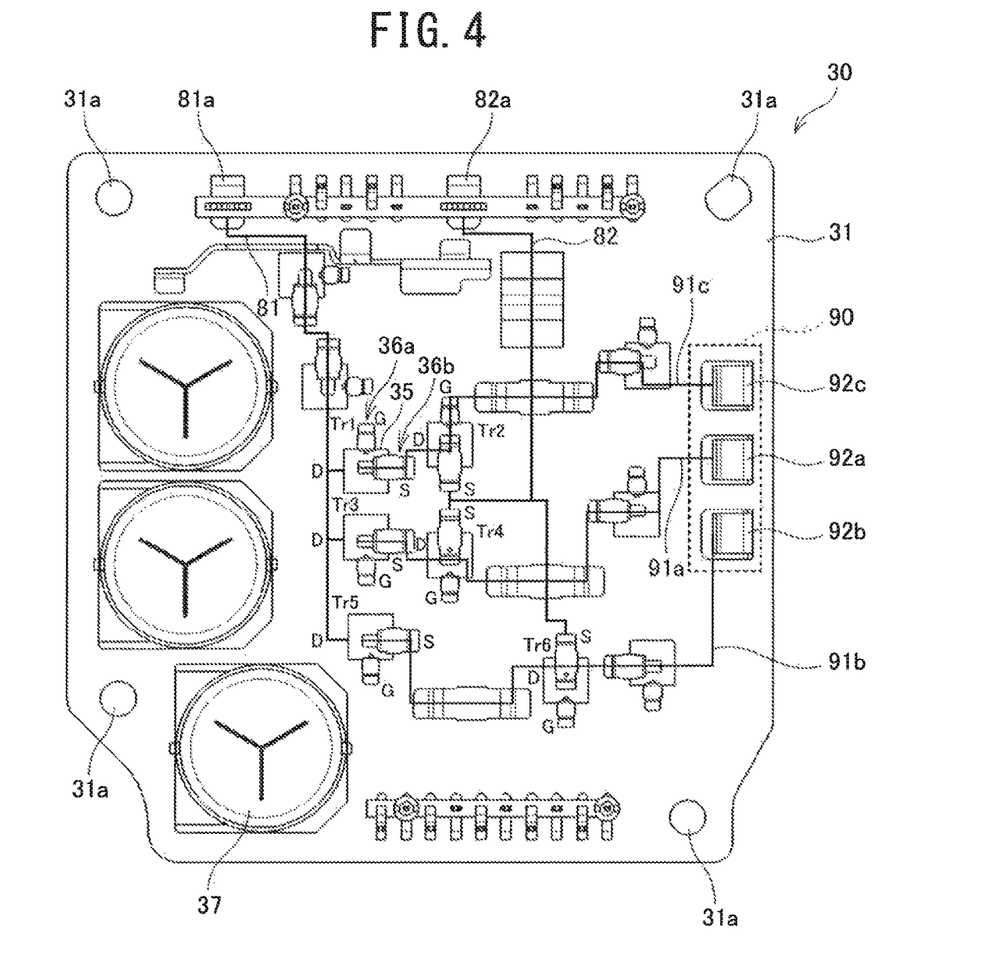
FIG. 4 is a plan view of the semiconductor module.

The semiconductor module 30 has the circuit configuration of the motor drive unit 13 as described above. As illustrated in FIG. 4, the six FETs Tr1 to Tr6, a positive electrode terminal 81a connected to the power supply line 81, and a negative electrode terminal 82a connected to the ground line 82 are mounted on a substrate 31. A three-phase output portion 90 including an a-phase output terminal 92a connected to the a-phase output line 91a, a b-phase output terminal 92b connected to the b-phase output line 91b, and a c-phase output terminal 92c connected to the c-phase output line 91c are mounted on the substrate 31. Other substrate-mounted components 37 including a capacitor are mounted on the substrate 31. Plural through-holes 31a into which an attachment screw 38 for attaching the semiconductor module 30 is inserted are formed on the substrate 31 of the semiconductor module 30.

Figure 5:
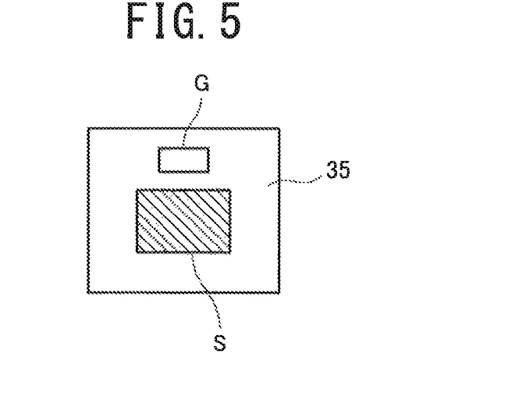
FIG. 5 is a plan view schematically illustrating a bare-chip FET.
Figure 6:
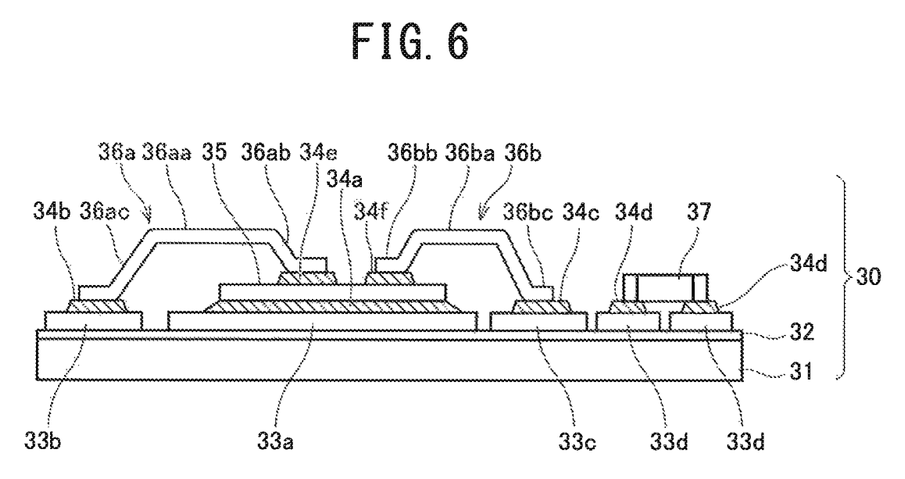
FIG. 6 is a diagram schematically illustrating a bonding state between an electrode of a bare-chip FET and a wiring pattern on a substrate.

Here, the mounting of the six FTTs Tr1 to Tr6 on the substrate 31 in the semiconductor module 30 will be described below. Each of the FETs Tr1 to Tr6 is constituted of a bare-chip FET (bare-chip transistor) 35 and includes a source electrode S and a gate electrode G on the bare-chip FET 35 and a drain electrode, not illustrated, on the lower surface of the bare-chip FET 35 as illustrated in FIG. 5. As illustrated in FIG. 6, the semiconductor module 30 includes the substrate 31 made of metal, and an insulating layer 32 is formed on the substrate 31. The substrate 31 is made of metal such as aluminum. Plural wiring patterns 33a to 33d are formed on the insulating layer 32. Each of the wiring patterns 33a to 33d is formed of metal such as copper or aluminum or alloy containing these kinds of metal.

The bare-chip FET 35 constituting each of the FETs Tr1 to Tr6 is mounted on one wiring pattern 33a of the plural wiring patterns 33a to 33d via a solder 34a. The drain electrode formed on the lower surface of the bare-chip FET 35 is connected to the wiring pattern 33a via a solder 34a. The top of the source electrode S of the bare-chip FET 35 and the top of another wiring pattern 33b of the plural wiring patterns 33a to 33d are connected by a source-electrode copper connector 36a via solders 34e and 34b.

The source-electrode copper connector 36a is formed by punching and bending a copper plate. The source-electrode copper connector 36a includes a flat portion 36aa, a connecting portion 36ab folded downward extending from one end of the flat portion 36aa and bonded to the source electrode S of the bare-chip FET 35 via a solder 34e, and a connecting portion 36ac folded downward extending from the other end of the flat portion 36aa and bonded to the wiring pattern 33b via a solder 34b.

The top of the gate electrode G of the bare-chip FET 35 and the top of still another wiring pattern 33c of the plural wiring patterns 33a to 33d are connected by a gate-electrode copper connector 36b via solders 34f and 34c.

The gate-electrode copper connector 36b is formed by punching and bending a copper plate. The gate-electrode copper connector 36b includes a flat portion 36ba, a connecting portion 36bb folded downward extending from one end of the flat portion 36ba and bonded to the gate electrode G of the bare-chip FET 35 via a solder 34f, and a connecting portion 36bc folded downward extending from the other end of the flat portion 36ba and bonded to the wiring pattern 33c via a solder 34c.

Another substrate-mounted component 37 such a capacitor are mounted on still another wiring pattern 33d of the plural wiring patterns 33a to 33d formed on the insulating layer 32 via a solder 34d.

The shape of the source-electrode copper connector 36a will be described below.

Figure 7:
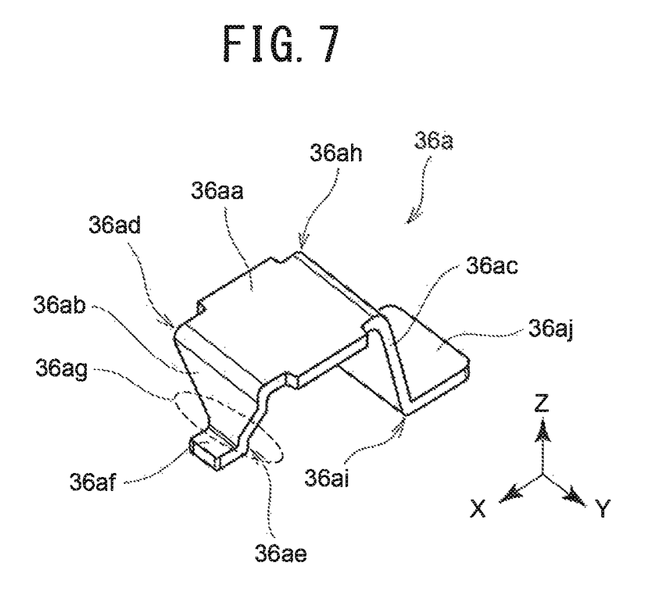
FIG. 7 is a perspective view illustrating a shape of a copper connector.

As illustrated in the perspective view of FIG. 7, the source-electrode copper connector 36a includes a flat portion 36aa, a connecting portion 36ab (first leg portion), and a connecting portion 36ac (second leg portion) to form a bridge shape. More specifically, in the source-electrode copper connector 36a, one end of the connecting portion 36ab is connected to one end in the lateral direction (X axis direction in FIG. 7) of the flat portion 36aa via a first folded portion 36ad, and a bonding face 36af extending outward is formed at the other end of the connecting portion 36ab via a second folded portion 36ae. The bottom of the bonding face 36af is bonded to the source electrode S of the bare-chip FET 35 via the solder 34e.

The connecting portion 36ab has a width-reduced portion 36ag in the vicinity of the bonding face 36af. The width-reduced portion 36ag has a taper shape of which the width decreases from the first folded portion 36ad to the second folded portion 36ae. The other end in the lateral direction of the flat portion 36aa is connected to one end of the connecting portion 36ac via a third folded portion 36ah, and a bonding face 36aj extending outward is formed at the other end of the connecting portion 36ac via a fourth folded portion 36ai. The bottom of the bonding face 36aj is bonded to the wiring pattern 33b via the solder 34b.

Figure 8:
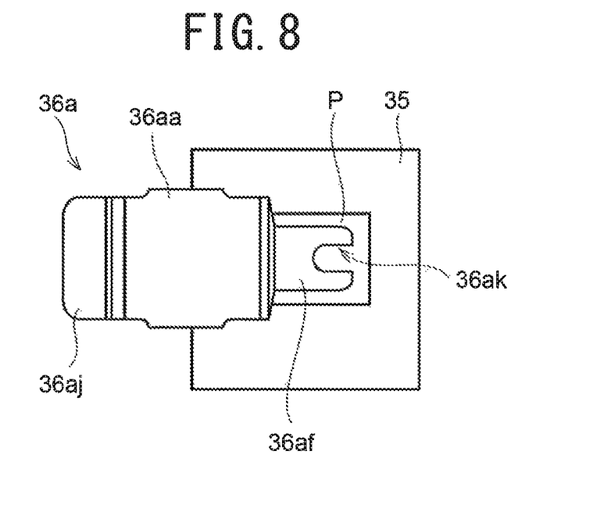
FIG. 8 is a diagram illustrating a shape of a stress-reducing portion.
Figure 9:
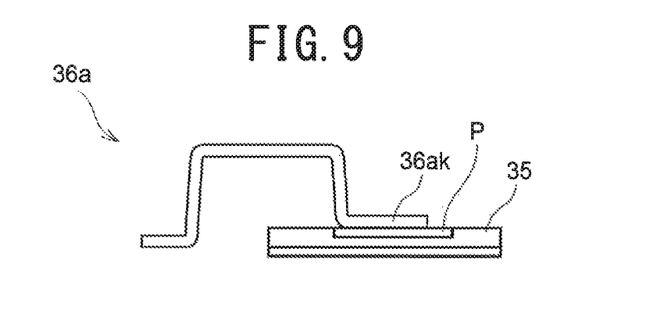
FIG. 9 is a diagram illustrating another example of the shape of the stress-reducing portion.
Figure 10:
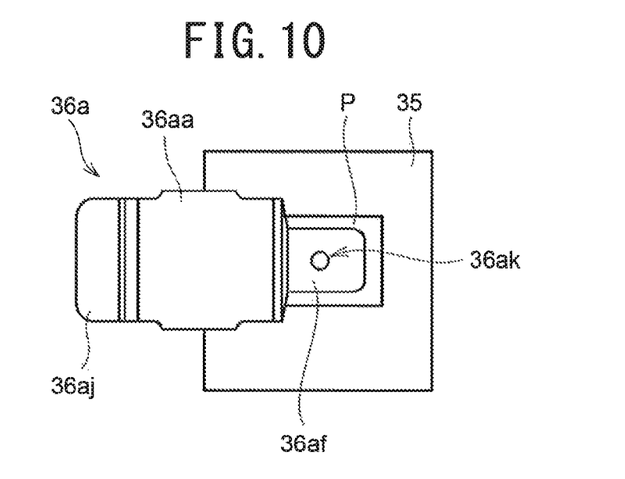
FIG. 10 is a diagram illustrating another example of the shape of the stress-reducing portion.
Figure 11:
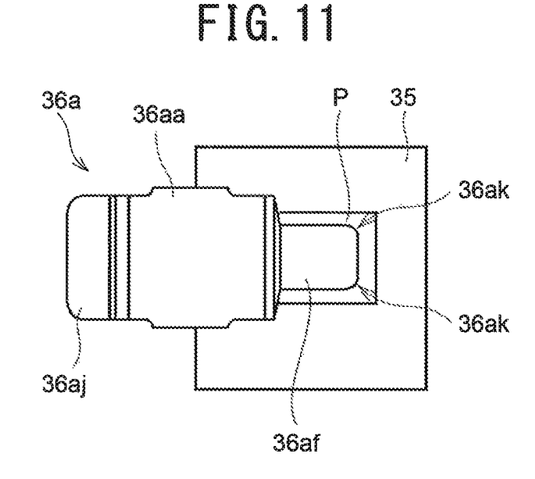
FIG. 11 is a diagram illustrating another example of the shape of the stress-reducing portion.

The bonding face 36af is provided with a stress-reducing portion 36ak having a shape for reducing the stress acting on the bonding face 36af. FIG. 8 to FIG. 11 are diagrams illustrating examples of the shape of the stress-reducing portion 36ak. In FIG. 8, FIG. 9, and FIG. 11, reference sign P represents a source PAD. The stress-reducing portion 36ak illustrated in FIG. 8 is a slit (i.e., notch) formed in the bonding face 36af. The shape or size of the slit can be appropriately selected as long as it can divide the tip of the bonding face 36af into two faces.

In another example of the stress-reducing portion 36ak, the thickness of the bonding face 36af may be reduced, for example, as illustrated in FIG. 9. As illustrated in FIG. 10, the stress-reducing portion 36ak may be a chamfered portion formed at the corners of the tip of the bonding face 36af. As illustrated in FIG. 10, the stress-reducing portion 36ak may be a hole formed at the center of the bonding face 36af. Here, the chamfered portion may be a large circle instead of the R-chamfer illustrated in FIG. 11 or may be a C-chamfer.

The source-electrode copper connector 36a may have any shape as long as it is a bridge shape jointing the source electrode S and the wiring pattern 33b. The stress-reducing portion 36ak may have any shape as long as it can be bonded to the source electrode S. Here, when a reflow bonding operation to be described later is performed at the time of soldering and the semiconductor module 30 is activated, the temperature rises by heat and thus a shape capable of reducing the thermal stress can be employed. The same is true of the gate-electrode copper connector 36b. The semiconductor module 30 having this configuration is attached onto the semiconductor module mounting part 21 of the case 20 with plural attachment screws 38 as illustrated in FIG. 3. Plural through-holes 31a into which the attachment screws 38 are inserted are formed in the substrate 31 of the semiconductor module 30.

When the semiconductor module 30 is attached onto the semiconductor module mounting part 21, the heat-dissipating sheet 39 is attached onto the semiconductor module mounting part 21 and the semiconductor module 30 is attached onto the top of the heat-dissipating sheet 39. By use of the heat-dissipating sheet 39, the heat generated in the semiconductor module 30 is dissipated to the case 20 via the heat-dissipating sheet 39. A control circuit including the control computing device 11 and the gate drive circuit 12 is formed by mounting plural electronic components on the control circuit board 40. After the semiconductor module 30 is attached onto the semiconductor module mounting part 21, the control circuit board 40 is attached onto the plural attachment posts 24 vertically standing on the semiconductor module mounting part 21 and the power and signal connector mounting part 22 with the plural attachment screws 41 from the upper side of the semiconductor module 30. Plural through-holes 40a into which the attachment screws 41 are inserted are formed in the control circuit board 40.

The power and signal connector 50 is used to supply DC power from a battery (not illustrated) to the semiconductor module 30 and to input various signals including signals from the torque sensor 7 and the vehicle speed sensor 9 to the control circuit board 40. The power and signal connector 50 is attached onto the power and signal connector mounting part 22 disposed on the semiconductor module mounting part 21 with plural attachment screws 51.

The three-phase output connector 60 is used to output currents from the a-phase output terminal 92a, the b-phase output terminal 92b, and the c-phase output terminal 92c. The three-phase output connector 60 is attached onto the three-phase output connector mounting part 23 disposed at an end in the width direction of the semiconductor module mounting part 21 with plural attachment screws 61. Plural through-holes 60a into which the attachment screws 61 are inserted are formed in the three-phase output connector 60. The cover 70 is attached onto the case 20 to which the semiconductor module 30, the control circuit board 40, the power and signal connector 50, and the three-phase output connector 60 are attached so as to cover the control circuit board 40 from the upper side of the control circuit board 40.

Figure 12A:
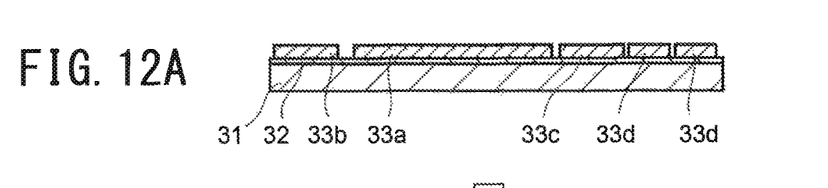
FIG. 12A to FIG. 12E are diagrams illustrating a method of manufacturing a semiconductor module.
Figure 12B:
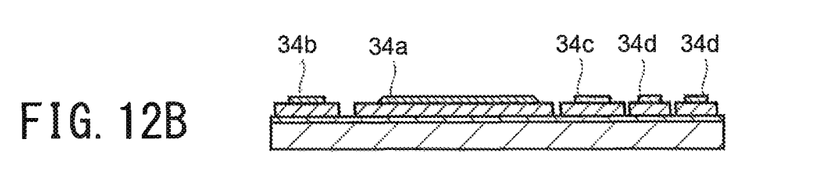
Figure 12C:
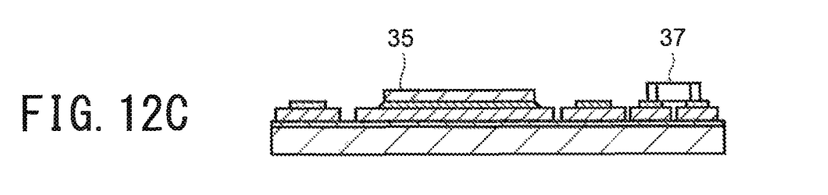

Next, a method of manufacturing the semiconductor module 30 will be described with reference to FIG. 12A to FIG. 12E. In manufacturing the semiconductor module 30, firstly, as illustrated in FIG. 12A, the insulating layer 32 is formed on one main surface of the substrate 31 made of metal (insulating layer forming step). Then, the plural wiring patterns 33a to 33d are formed on the insulating layer 32 (wiring pattern forming step). Thereafter, as illustrated in FIG. 12B, a solder paste (i.e., the solders 34a to 34d) is applied on the plural wiring patterns 33a to 33d (solder paste applying step). Then, as illustrated in FIG. 12C, one bare-chip FET 35 is mounted on the solder paste (i.e., the solder 34a) applied onto one wiring pattern 33a of the plural wiring patterns 33a to 33d (bare-chip FET mounting step), and the other substrate-mounted components 37 are mounted on the solder paste (i.e., the solder 34d) applied onto another wiring pattern 33d. Another bare-chip FET 35 is also mounted on a wiring pattern identical to or different from the wiring pattern 33a.

Figure 12D:
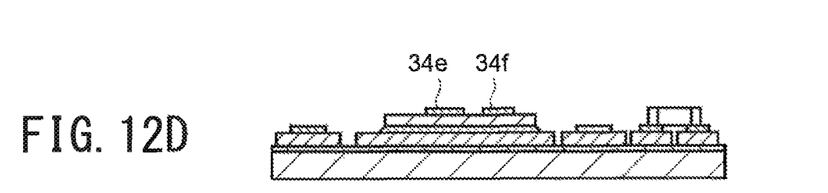
Figure 12E:
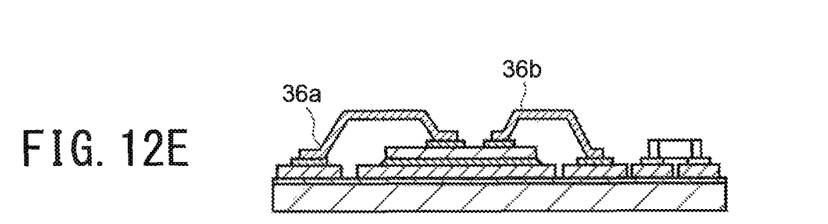
Figures 13A, 13C:
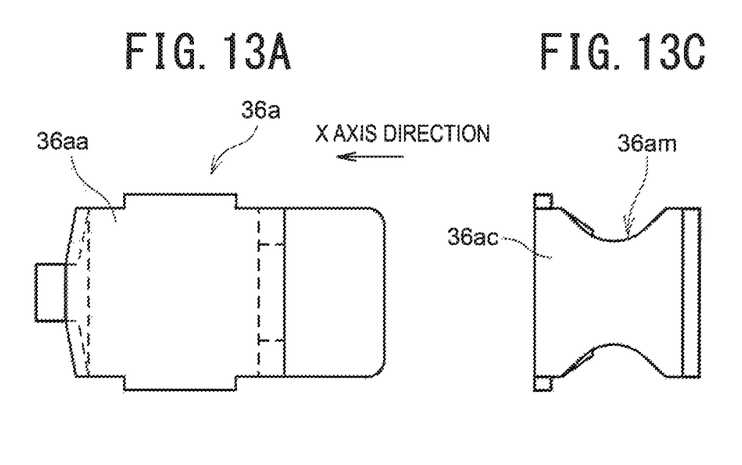
FIG. 13A to FIG. 13D are diagrams illustrating examples of a dumbbell portion formed in a first leg portion and a second leg portion.
Figure 13B:
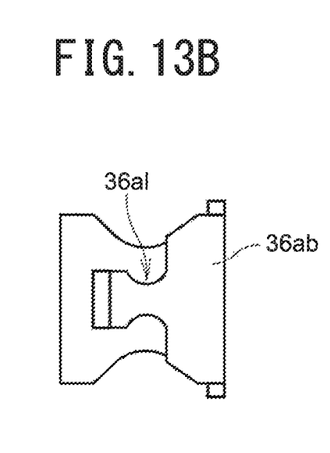
Figure 13D:
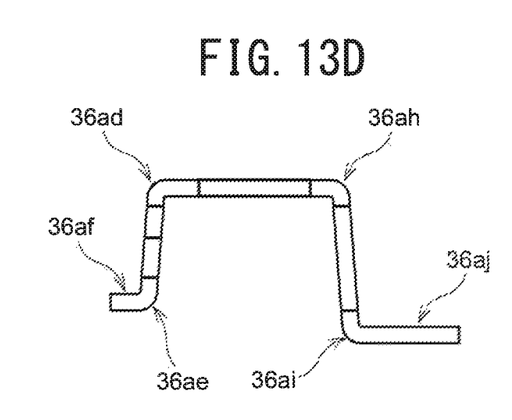

Subsequently, as illustrated in FIG. 12D, solder paste (i.e., the solders 34e and 34f) is applied onto the source electrode S and the gate electrode G formed on the top surface of the bare-chip FET 35 (solder paste applying step). Thereafter, as illustrated in FIG. 12E, the source-electrode copper connector 36a is mounted on the solder paste (i.e., the solder 34e) applied onto the source electrode S of the bare-chip FET 35 and the solder paste (i.e., the solder 34b) applied onto the wiring pattern 33b other than the wiring pattern 33a, on which the bare-chip FET 35 is mounted, of the plural wiring patterns 33a to 33d (source-electrode copper connector mounting step).

In addition, the gate-electrode copper connector 36b is mounted on the solder paste (i.e., the solder 34f) applied onto the gate electrode G of the bare-chip FET 35 and the solder paste (i.e., the solder 34c) applied onto still another wiring pattern 33c other than the wiring pattern 33a on which the bare-chip FET 35 is mounted and the wiring pattern 33b on which the source-electrode copper connector 36a is mounted, of the plural wiring patterns 33a to 33d (gate-electrode copper connector mounting step). An intermediate semiconductor module assembly is configured in this way.

The intermediate semiconductor module assembly configured through the steps described above is placed in a reflow furnace (not illustrated), and the bonding between one wiring pattern 33a of the plural wiring patterns 33a to 33d and the bare-chip FET 35 via the solder 34a, the bonding between the wiring pattern 33d and the other substrate-mounted components 37 via the solder 34d, the bonding between the source electrode S formed on the top surface of the bare-chip FET 35 and the source-electrode copper connector 36a via the solder 34e, the bonding between another wiring pattern 33b of the plural wiring patterns 33a to 33d and the source-electrode copper connector 36a via the solder 34b, the bonding between the gate electrode G formed on the top surface of the bare-chip FET 35 and the gate-electrode copper connector 36b via the solder 34f, and the bonding between still another wiring pattern 33c of the plural wiring patterns 33a to 33d and the gate-electrode copper connector 36b via the solder 34c are collectively carried out (bonding step). The semiconductor module 30 is completed in this way.

Here, since the source electrode S of the bare-chip FET 35 and the wiring pattern 33b on the substrate 31 can be bonded by using the source-electrode copper connector 36a and the gate electrode G of the bare-chip FET 35, and another wiring pattern 33c on the substrate 31 can be bonded by using the gate-electrode copper connector 36b, the bonding operations can be carried out by the soldering operation. Accordingly, it is possible to bond the source electrode S of the bare-chip FET 35 and the wiring pattern 33b on the substrate 31 and bond the gate electrode G of the bare-chip FET 35 and another wiring pattern 33c on the substrate 31 simultaneously in the same process as the soldering operation performed to mount the bare-chip FET 35 or the other substrate-mounted components 37 on the wiring patterns 33a and 33d on the substrate 31. As a result, it is possible to shorten the manufacturing tact time of the semiconductor module 30 and to eliminate the necessity of dedicated wire bonding apparatus facilities, thereby reducing the manufacturing costs of the semiconductor module 30.

The substrate 31 of the semiconductor module 30 is formed of aluminum and the source-electrode copper connector 36a and the gate-electrode copper connector 36b is formed of a copper material. The linear expansion coefficient of aluminum is $23.6 \times 10^{-6}/°C$, the linear expansion coefficient of the copper material is $16.8 \times 10^{-6}/°C$, and the linear expansion coefficient of silicon of the bare-chip FET 35 is $2.5 \times 10^{-6}/°C$. That is, the substrate 31 is more easily deformed than the copper connectors 36a and 36b with respect to a change in temperature.

Accordingly, when the temperature rises by emission of heat in the reflow step or in operation of the electric power steering (EPS) apparatus, stress is applied to the copper connectors 36a and 36b due to a difference in expansion coefficient between the substrate 31 and the copper connectors 36a and 36b and a difference in expansion coefficient between the bare-chip FET 35 and the copper connectors 36a and 36b. In this case, when the copper connectors 36a and 36b do not have a structure capable of reducing the stress, the solder bonded to the bare-chip FET 35 may be removed.

On the contrary, in this embodiment, the copper connectors 36a and 36b are formed in abridge shape, the width-reduced portion 36ag is formed in the vicinity of the bonding face 36af bonded to the electrode of the bare-chip FET 35, and the stress-reducing portion 36ak is formed in the bonding face 36af bonded to the electrode of the bare-chip FET 35. In this way, by forming the copper connectors 36a and 36b in a bridge shape, it is possible to absorb displacements in the vertical and lateral directions (i.e., the Z axis direction and the X axis direction in FIG. 7). By providing the width-reduced portion 36ag, the bending start point can be narrowed and it is thus possible to absorb the displacement in the longitudinal direction (i.e., the Y axis direction in FIG. 7) and the torsion direction.

That is, even when the substrate 31 or the copper connectors 36a and 36b are deformed due to thermal expansion or thermal contraction, the bending of the copper connectors 36a and 36b can be facilitated. Since the width-reduced portion 36ag is disposed in the vicinity of the bonding face 36af, the solder between the copper connectors 36a and 36b and the bare-chip FET 35 are not removed well when the copper connectors 36a and 36b are folded with the width-reduced portion 36ag as a start point.

Since the stress-reducing portion 36ak is provided, it is possible to reduce the stress in the torsion direction. Particularly, when the stress-reducing portion of the copper connectors 36a and 36b has the slit shape illustrated in FIG. 8, the number of contacts with the bare-chip FET 35 is two and the width of the bonding portions further decreases. Accordingly, it is possible to easily follow even torsion. Since the number of contacts is two to constitute a dual system, it is possible to improve electrical reliability.

When the thin plate shape illustrated in FIG. 9 is employed, the thickness is small and the stress-reducing portion can be easily twisted and thus can easily absorb deformation. When the rounded tip illustrated in FIG. 10 is employed, it is possible to avoid concentration of the stress on the corners due to torsion. When the hole illustrated in FIG. 11 is employed, the stress-reducing portion can easily follow even torsion. Since the solder flows on the top surface of the bonding face 36af and radially extends due to an infiltration and wetting phenomenon, the solder is not removed well even with torsion.

The shape of the source-electrode copper connector 36a provided with a first dumbbell portion 36al and a second dumbbell portion 36am for reducing the stress acting on the bonding face 36af and the bonding face 36af will be described below. Both or one of the first dumbbell portion 36al and the second dumbbell portion 36am may be provided in addition to the stress-reducing portion 36ak and the width-reduced portion 36ag, or may be provided instead of the stress-reducing portion 36ak or the width-reduced portion 36ag. Both or one of the first dumbbell portion 36al and the second dumbbell portion 36am may be provided without forming the stress-reducing portion 36ak and the width-reduced portion 36ag.

As illustrated in FIG. 13A to FIG. 13D, the source-electrode copper connector 36a has a bridge shape including the flat portion 36aa, the connecting portion 36ab (i.e., a first leg portion), and the connecting portion 36ac (i.e., a second leg portion). More specifically, in the source-electrode copper connector 36a, one end of the connecting portion 36ab is connected to one end in the lateral direction (i.e., the X axis direction in FIG. 13A to FIG. 13D) of the flat portion 36aa via the first folded portion 36ad, and the bonding face 36af extending outward is connected to the other end of the connecting portion 36ab via the second folded portion 36ae. The bottom of the bonding face 36af is bonded to the source electrode of the bare-chip FET 35 via the solder 34e.

The first dumbbell portion 36al having a small width is formed in the vicinity of the bonding face 36af of the connecting portion 36ab. Specifically, for example, notches each having a semi-circular shape are formed on both sides, respectively, in the width direction of the connecting portion 36ab so as to face each other. By these notches, the first dumbbell portion 36al having a dumbbell shape is formed in the connecting portion 36ab.

One end of the connecting portion 36ac is connected to the other end in the lateral direction of the flat portion 36aa via the third folded portion 36ah, and the bonding face 36aj extending outward is connected to the other end of the connecting portion 36ac via the fourth folded portion 36ai. The bottom of the bonding face 36aj is bonded to the wiring pattern 33b via the solder 34b.

The second dumbbell portion 36am having a small width is formed in the vicinity of the substantially center of the connecting portion 36ac. Specifically, for example, notches each having a semi-circular shape are formed on both sides, respectively, in the width direction of the connecting portion 36ac so as to face each other. By these notches, the second dumbbell portion 36am having a dumbbell shape is formed in the connecting portion 36ab.

to the provision of the first dumbbell portion 36al and the second dumbbell portion 36am having small widths, respectively, the source-electrode copper connector 36a can be easily twisted and can easily absorb displacements. Regarding the stress-reducing effect of the first dumbbell portion 36al and the second dumbbell portion 36am, since the first dumbbell portion 36al and the second dumbbell portion 36am expand and contract and the concave portions of the first dumbbell portion 36al and the second dumbbell portion 36am can be deformed in the bending direction, an advantageous effect of a leaf spring is achieved. The source-electrode copper connector 36a can further absorb deformation in the up-down direction and the lateral direction by the stress reduction due to the bridge shape.

The connecting portion 36ab and the connecting portion 36ac may be provided with a curved portion 36an and a curved portion 36ao for reducing the stress acting on the bonding face 36af and the bonding face 36af (see FIG. 14A to FIG. 14C), instead of the first dumbbell portion 36al and the second dumbbell portion 36am. The shape of the source-electrode copper connector 36a provided with the curved portion 36an and the curved portion 36ao will be described below. Here, both or either one of the curved portion 36an and the curved portion 36ao may be provided in addition to the stress-reducing portion 36ak and the width-reduced portion 36ag, or may be provided instead of the stress-reducing portion 36ak or the width-reduced portion 36ag. Both or one of the curved portion 36an and the curved portion 36ao may be provided without forming the stress-reducing portion 36ak and the width-reduced portion 36ag.

Figure 14A:
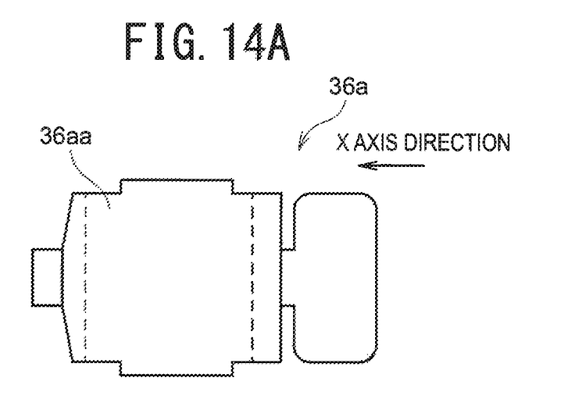
FIG. 14A to FIG. 14C are diagrams illustrating an example of a curved portion formed in the first leg portion and the second leg portion.
Figure 14B:
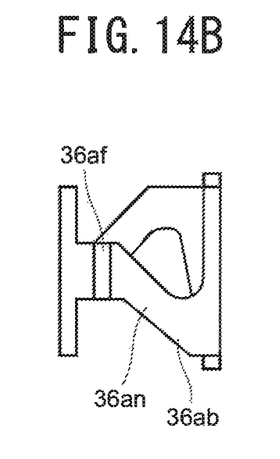
Figure 14C:
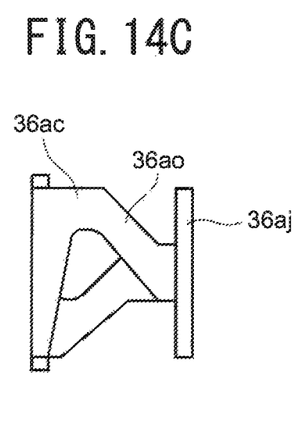

The source-electrode copper connector 36a illustrated in FIG. 14A to FIG. 14C has the same basic configuration as the source-electrode copper connector 36a illustrated in FIG. 13A to FIG. 13D, but both are different from each other in the shapes of the connecting portion 36ab and the connecting portion 36ac. The connecting portion 36ab and the connecting portion 36ac of the source-electrode copper connector 36a illustrated in FIG. 14A to FIG. 14C are provided with the curved portion 36an and the curved portion 36ao curved in a substantially letter "7" shape.

Specifically, the connecting portion 36ab includes a large-width portion connected to one end in the lateral direction (i.e., the X axis direction in FIG. 7) of the flat portion 36aa and having the same width as the flat portion 36aa and an inclined portion extending in an inclination direction from one end of the large-width portion in the width direction (i.e., the Y axis direction in FIG. 7) of the flat portion 36aa to the bonding face 36af located at the center in the width direction of the flat portion 36aa. The inclined portion has a width smaller than that of the large-width portion and has a substantially constant width over the total length from the large-width portion to the bonding face 36af. Accordingly, the connecting portion 36ab is curved in a substantially letter "7" shape as a whole to form the curved portion 36an.

On the other hand, the connecting portion 36ac is the substantially same as the connecting portion 36ab and includes a large-width portion connected to one end in the lateral direction (i.e., the X axis direction in FIG. 7) of the flat portion 36aa and having the same width as the flat portion 36aa and an inclined portion extending in an inclination direction from one end of the large-width portion in the width direction (i.e., the Y axis direction in FIG. 7) of the flat portion 36aa to the bonding face 36aj located at the center in the width direction of the flat portion 36aa. The inclined portion has a width smaller than that of the large-width portion and has a substantially constant width over the total length from the large-width portion to the bonding face 36aj. Accordingly, the connecting portion 36ac is curved in a substantially letter "7" shape as a whole to constitute the curved portion 36ao.

Since the same operational advantages as the first dumbbell portion 36al and the second dumbbell portion 36am are achieved by the curved portion 36an and the curved portion 36ao, the source-electrode copper connector 36a illustrated in FIG. 14A to FIG. 14C can be easily twisted and can easily absorb displacements. The source-electrode copper connector 36a illustrated in FIG. 14A to FIG. 14C can further absorb deformation in the up-down direction and the lateral direction by the stress reduction due to the bridge shape.

As described above, even when the copper connectors 36a and 36b are thermally deformed in the reflow process or the substrate 31 expands or contracts during activation of the Electric Power Steering (EPS) apparatus, the semiconductor module 30 according to this embodiment can appropriately absorb displacements and it is thus possible to prevent the solder between the copper connectors 36a and 36b and the bare-chip FET 35 from being removed, thereby ensuring the reliability of electrical connection. It is also possible to prevent destruction of the copper connectors 36a and 36b themselves.

While the embodiment of the present invention has been described above, the present invention is not limited to the above embodiment and can be modified and improved in various forms.

For example, the semiconductor module 30 employs the bare-chip FET 35, but is not limited to the bare-chip FET 35 and may employ other bare-chip transistors such as a bare-chip IGBT. When another bare-chip transistor is employed, the top of an electrode formed on the top surface of the bare-chip transistor and the top of the wiring pattern other than the wiring pattern connected to the bare-chip transistor of plural wiring patterns can be connected via a copper connector via solder. Accordingly, the connection between the electrode of the bare-chip transistor and the wiring pattern on the substrate can be performed simultaneously in the same process as the soldering work which is performed to mount the bare-chip transistor or other substrate-mounted components on the wiring patterns on the substrate.

When a bare-chip IGBT is used as the bare-chip transistor, it is preferable that the emitter electrode and the gate electrode formed on the bare-chip IGBT be connected to the wiring pattern on the substrate via the copper connector by using solder. In this way, when the bare-chip IGBT is used and the emitter electrode and the gate electrode formed on the bare-chip IGBT are connected to the wiring pattern on the substrate by using solder via the copper connector, the connection between the emitter electrode of the bare-chip IGBT and the wiring pattern on the substrate and the connection between the gate electrode of the bare-chip IGBT and the wiring pattern on the substrate can be performed simultaneously in the same process as the soldering work which is performed to mount the bare-chip IGBT or other substrate-mounted components on the wiring patterns on the substrate.

In the semiconductor module 30, there is one type of gate-electrode copper connector and there are two types of source-electrode copper connectors including a first source-electrode copper connector (see Tr2 and Tr4 in FIG. 4) arranged 180° straightly with respect to the gate-electrode copper connector and a second source-electrode copper connector (see Tr1, Tr3, and Tr5 in FIG. 4) arranged 90° perpendicularly with respect to the gate-electrode copper connector. The one type of gate-electrode copper connector and any source-electrode copper connector selected from two types of the first source-electrode copper connector and the second source-electrode copper connector can be used in combination for one bare-chip FET.

The arrangement of the first source-electrode copper connector with respect to the gate-electrode copper connector (i.e., the angle formed by the gate-electrode copper connector and the first source-electrode copper connector) preferably ranges from 95° to 265°, more preferably ranges from 160° to 200°, still more preferably ranges from 175° to 185°, and is most preferably set to 180°.

The arrangement of the second source-electrode copper connector with respect to the gate-electrode copper connector (i.e., the angle formed by the gate-electrode copper connector and the second source-electrode copper connector) preferably ranges from 5° to 175°, more preferably ranges from 70° to 120°, still more preferably ranges from 85° to 95°, and is most preferably set to 90°.

Similarly to the above-mentioned semiconductor module 30, according to this semiconductor module, a degree of freedom in arranging the bare-chip transistor mounted on the substrate increases, a degree of freedom in design of interconnections on the substrate increases, and thus the layout of the semiconductor module on the substrate can be made to be compact. It is possible to easily make the path lengths for phases of a three-phase motor on the substrate identical. Accordingly, it is possible to make characteristics of the phases of the three-phase motor, particularly, the impedance characteristics of the phases, easily match each other, thereby improving ripple accuracy of torque, velocity, and so on.

REFERENCE SIGNS LIST

1: steering wheel
2: column shaft
3: reduction gear
4A, 4B: universal joint
5: rack and pinion mechanism
6: tie rod
7: torque sensor
8: electric motor
9: vehicle speed sensor
10: controller
11: control computing device
12: gate drive circuit
13: motor drive unit
14: breaker device for emergency stop
15: current detecting circuit
16: rotation sensor
17: rotor position detecting circuit
18: IGN voltage monitoring unit
19: power supply circuit unit
20: case
21: semiconductor module mounting part
21a: screw hole
22: power and signal connector mounting part
23: three-phase output connector mounting part
23a: screw hole
24: attachment post
24a: screw hole
30: semiconductor module
31: substrate
31a: through-hole
32: insulating layer
33a to 33d: wiring pattern
34a to 34d: solder
35: bare-chip FET (bare-chip transistor)
36a: source-electrode copper connector
36aa: flat portion
36ab: connecting portion (first leg portion)
36ac: connecting portion (second leg portion)
36ad: first folded portion
36ae: second folded portion
36af: bonding face
36ag: width-reduced portion
36ah: third folded portion
36af: fourth folded portion
36af: bonding face
36ak: stress-reducing portion
36al: first dumbbell portion
36am: second dumbbell portion
36b: gate-electrode copper connector
36ba: flat portion
36bb: connecting portion
36bc: connecting portion
37: substrate-mounted components
38: attachment screw
39: heat-dissipating sheet
40: control circuit substrate
40a: through-hole
41: attachment screw
50: power and signal connector
51: attachment screw
60: three-phase output connector
60a: through-hole
61: attachment screw
70: cover
81: power supply line
81a: positive electrode terminal
82: ground line
82a: negative electrode terminal
90: three-phase output portion
91a: a-phase output line
91b: b-phase output line
91c: c-phase output line
G: gate electrode (electrode)
S: source electrode (electrode)

The invention claimed is:
1. A semiconductor module comprising:
a substrate formed of a metal;
an insulating layer formed on the substrate;
a plurality of wiring patterns formed on the insulating layer;
a bare-chip transistor mounted on one of the plurality of wiring patterns via a solder; and
a copper connector formed of a copper plate and connecting an electrode formed on a top surface of the bear-chip transistor and another one of the plurality of wiring patterns via a solder, wherein the copper connector includes a flat portion, a first leg portion folded downward extending from one end of the flat portion and bonded to the electrode, and a second leg portion folded downward extending from the other end of the flat portion and bonded to the another one of the plurality of wiring patterns to form a bridge shape, wherein a width-reduced portion having a width smaller than another part of the first leg portion is formed in the vicinity of the bonding face of the first leg portion bonded to the electrode, and a stress-reducing portion having a shape for reducing stress acting on the bonding face is formed on the bonding face of the first leg portion bonded to the electrode, wherein the bare-chip transistor is a bare-chip FET with a top surface on which a source electrode and a gate electrode are formed, the copper connector includes a source-electrode copper connector and a gate-electrode copper connector, top of the source electrode of the bare-chip FET and top of yet another one of the plural of wiring patterns are connected by the source-electrode copper connector via soldering, and a top of the gate electrode of the bare-chip FET and a top of further another one of the plural of wiring patterns are bonded by the gate-electrode copper connector via soldering, and wherein there is one type of the gate-electrode copper connector, and there are two types of the source-electrode copper connectors including a first source-electrode copper connector arranged 180° straightly with respect to the gate-electrode copper connector and a second source-electrode copper connector arranged 90° perpendicularly with respect to the gate-electrode copper connector, the one type of the gate-electrode copper connector and any one of the source-electrode copper connector of the two types of the first source-electrode copper connector or the second source-electrode copper connector are used in combination for the bare-chip FET.

2. The semiconductor module according to claim 1, wherein a notch portion is formed as the stress-reducing portion in the bonding face.

3. The semiconductor module according to claim 2, wherein the bonding face is formed to have a small thickness, as the stress-reducing portion.

4. The semiconductor module according to claim 1, wherein the bonding face is formed to have a small thickness, as the stress-reducing portion.

5. The semiconductor module according to claim 1, wherein a chamfered portion is formed as the stress-reducing portion at a corner of the bonding face.

6. The semiconductor module according to claim 1, wherein a hole is formed as the stress-reducing portion at the center of the bonding face.

7. The semiconductor module according to claim 1, wherein a dumbbell portion having a dumbbell shape for reducing the stress acting on the bonding face is formed in each of the first leg portion and the second leg portion.

8. The semiconductor module according to claim 1, wherein a curved portion curved in a substantially letter 7 shape for reducing stress acting on the bonding face is formed in each of the first leg portion and the second leg portion.

* * * * *